(12) United States Patent
Abele et al.

(10) Patent No.: US 9,983,401 B2
(45) Date of Patent: *May 29, 2018

(54) MEMS DEVICE

(71) Applicant: Intel Corporation, Santa Clara, CA (US)

(72) Inventors: Nicolas Abele, Demoret (CH); Faouzi Khechana, Preverenges (CH); Julien Gamet, Saint Pierre d'Allevard (FR)

(73) Assignee: INTEL CORPORATION, Santa Clara, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/156,200

(22) Filed: May 16, 2016

(65) Prior Publication Data

US 2016/0370576 A1    Dec. 22, 2016

Related U.S. Application Data

(63) Continuation of application No. 14/406,498, filed as application No. PCT/EP2012/061196 on Jun. 13, 2012, now Pat. No. 9,341,840.

(51) Int. Cl.
*G02B 26/08* (2006.01)
*B81B 3/00* (2006.01)
*G02B 26/10* (2006.01)

(52) U.S. Cl.
CPC ........ *G02B 26/0833* (2013.01); *B81B 3/0072* (2013.01); *G02B 26/085* (2013.01); *G02B 26/101* (2013.01); *G02B 26/105* (2013.01); *B81B 2201/042* (2013.01); *B81B 2203/0154* (2013.01); *B81B 2203/0181* (2013.01); *B81B 2203/06* (2013.01)

(58) Field of Classification Search
CPC ............ G02B 26/0833; G02B 26/0858; G02B 26/101; G02B 26/085; G02B 26/0841; G02B 26/105; B81B 3/0072; B81B 2201/042; B81B 2203/0154; B81B 2203/0181; B81B 2203/06
USPC ..................... 359/198.1–199.4, 200.6–200.8, 359/213.1–214.1, 224.1–224.2
See application file for complete search history.

(56) References Cited

U.S. PATENT DOCUMENTS

| 9,341,840 B2 * | 5/2016 | Abele ................ G02B 26/0833 |
| 2012/0120470 A1 * | 5/2012 | Kitazawa ............... H02N 1/006 |
| | | 359/200.1 |
| 2013/0107339 A1 * | 5/2013 | Horie ................ G02B 26/0833 |
| | | 359/213.1 |

* cited by examiner

*Primary Examiner* — James Phan (57) ABSTRACT

According to the present invention there is provided a MEMS device comprising, a mirror which is connected to a fixed portion by means of a first and second torsional arm, each of the first and second torsional arms are configured such that they can twist about torsional axes so as to oscillate the mirror about a first oscillation axes, and wherein the first and second torsional arms are each configured to have two or more meanders and wherein the first and second torsional arms are arranged symmetrically relative to the first oscillation axis.

9 Claims, 8 Drawing Sheets

MEMS DEVICE

RELATED CASE

This application is a continuation of, claims the benefit of and priority to, previously filed U.S. patent application Ser. No. 14/406,498, filed Dec. 15, 2014, now U.S. Pat. No. 9,341,840, which is a national stage application of PCT/EP2012/061196 filed Jun. 13, 2012, both of which are hereby incorporated by reference in their entirety.

FIELD OF THE INVENTION

The present invention relates to a MEMS device, and in particular to a MEMS device which comprises torsional arms which are configured so that an improved distribution of stress throughout these torsional arms is achieved, thereby making the MEMS device is less susceptible to breakage and enabling the MEMS device to have improved shock-resistance.

DESCRIPTION OF RELATED ART

A MEMS micro-mirror device is a device that contains an optical MEMS (Micro-Electrical-Mechanical-System). The optical MEMS may comprise a cylindrical, oval rectangular, square or any shape micro-mirror that is adapted to move and to deflect light over time. The micro-mirror is connected by straight torsion arms to a fixed part and can tilt and oscillate along one or two axis. For example it can oscillate vertically and horizontally. The Different actuation principles can be used, including electrostatic, thermal, electromagnetic or piezo-electric or a combination of those. MEMS devices are known in which the area of these micro-mirrors are around a few mm.sup.2. In this case, the dimensions of the MEMS device, comprising the packaging, is around ten to few tens of mm.sup.2. This device is usually made of silicon, and can be encapsulated in a package that can include the driving actuation electronics. Various optical components, such as for example lenses, beam combiner, quarter-wave plates, beam splitter and laser chips, are assembled with the packaged MEMS to build a complete system.

A typical application of the micro-mirror devices is for projection systems. In a projection system, a 2-D image or a video can be displayed on any type of surface: each pixel is generated by combining modulated red, green and blue laser light sources, by means of, for example, a beam combiner. A MEMS micro-mirror device directs this beam of light to a projection surface and reproduces the image, or the video, pixel-by-pixel. By means of its oscillations, the micro-mirror within the device will continuously scan from left to right and from top to bottom so that each pixel of the 2-D image is displayed on the screen.

There is a demand for the oscillating micro-mirrors of MEMS micro-mirror devices to achieve larger angles. The angle of oscillation of the micro-mirror determines the area of the display screen over which light is scanned, and thus the area of the display screen over which the image is projected.

The size of the reflective surface of the micro-mirror influences the quality of the projected image on the display screen; the larger the reflective surface the more light which is reflected by the micro-mirror. The more light which is reflected by the micro-mirror the higher the brightness of the projected image. Thus, there is a demand for large micro-mirrors which will provided a larger reflective surface so that a higher brightness image can be projected.

However the size of the oscillating angle and size of the reflective surfaces is limited by the fragility of the straight torsional arms which connect the micro-mirror to the fixed part of the MEMS micro-mirror device. Large oscillations of the micro-mirror generate stresses in the straight torsional arms which can cause the straight torsional arms to break. To avoid breakage of the straight torsional arms the arms are usually made stiffer; however making the arms stiffer increases the power consumption of the MEMS micro-mirror device since more power is required to oscillate the micro-mirror.

The fragility of the straight torsional arms also decreases the shock-resistance of the MEMS micro-mirror device. A decrease in shock-resistance will mean that the MEMS micro-mirror device is more susceptible to breakage if dropped.

Typically the micro-mirror of a MEMS micro-mirror device is defined by a metallic layer e.g. Aluminum, gold, silver, dielectric layer like SiO2, SiN or stack of these materials, which is disposed on a Silicon substrate. When the metallic layer is applied to the Silicon substrate, stresses are generated in the micro-mirror; the larger the micro-mirror the larger the deformation and/or stresses which are generated. Metallic layer creates a torque stress in the straight torsional arms at the point where the straight torsional arms attach to the micro-mirror; the larger the metallic layer (i.e. the larger the micro-mirror) then the larger the torque stress which is applied to the straight torsional arms. This torque stress can cause bending of the straight torsional arms. Bending of the straight torsional arms causes displacement of the micro-mirror away from its desired plane.

The torque stress created in the straight torsional arms by the metallic layer varies according to the temperature of the MEMS micro-mirror device. Consequently, the degree of bending of the straight torsional arms varies and the amount of displacement of the micro-mirror away from its desired plane varies according to the temperature of the MEMS micro-mirror device.

Additionally, straight torsional arms are long; the length of the torsional arms increases the overall size of the MEMS micro-mirror device. Moreover, to achieve a low-power MEMS micro-mirror device, the length of the straight torsional arms is typically increased so that less power is required to achieve oscillation of the micro-mirror.

It is an aim of the present invention to obviate or mitigate at least some of the above-mentioned disadvantages.

BRIEF SUMMARY OF THE INVENTION

According to the present invention there is provided, a MEMS device comprising, a mirror which is connected to a fixed portion by means of a first and second torsional arm, each of the first and second torsional arms are configured such that they can twist about torsional axes so as to oscillate the mirror about a first oscillation axes, and wherein the first and second torsional arms are each configured to have two or more meanders and wherein the first and second torsional arms are arranged symmetrically relative to the first oscillation axis.

The torsional arms arranged symmetrically relative to the first oscillation axis means that the torsional arms are positioned such that they are distributed symmetrically relative to the first oscillation axis; this includes the possibility of both torsional arms being positioned on the first oscillation axis.

Providing two or more meanders in the first and second torsional arms enables the provision of longer torsional arms without having to increase the size of the MEMS device to accommodate long torsional arms. For a given mechanical stiffness, i.e for a given applied power, longer torsional arms in a such arrangement enable to optimize the mechanical stress inside the arms by increasing the width and/or the thickness for example. For a given space and a given power, two or more meanders in the first and second torsional arms enables therefore to increase the reliability of the device in regard of the mechanical shock and/or the torsional stress in working condition. More importantly the geometry of the torsional arms can be locally tuned in order to adjust the mechanical resistance to avoid a large density of stress occurring which could cause breakage. A smoothing of the distribution of the stress resulting from a mechanical shock enables both to make the device more robust in regions where to high stresses occur and reduces the stiffness, i.e. the power consumption, in regions where low stresses occur. Accordingly, the MEMS device of the present invention has improved shock-resistance. Thus, the combination of the meanders and the arrangement of the arms symmetrically relative to the first oscillation axis, allows for (1) less stress on the torsional arms (2) increased distribution of stresses throughout the first and second torsional arms and (3) better shock resistance.

Each of the first and second torsional arms may be configured to have between 2-25 meanders. Preferably, each of the first and second torsional arms are configured to have between 5-15 meanders. Most preferably, each of the first and second torsional arms are configured to have 8 meanders.

Each of the first and second torsional arms may be configured to have a length between 20 microns to 5000 microns. This length is the length measured when first and second torsional arms are straightened so as to remove the meanders.

The first and second torsional arms may be configured to extend between 5 microns to 400 microns along the torsional axes. This is the effective length of the arms when the arms comprise two or more meanders.

The first and second torsional arms may be arranged such that the torsional axes about which the first and second torsional arms are configured to twist, are each parallel to the first oscillation axis. Preferably the torsional axes about which the first and second torsional arms are configured to twist each bisect a centre of the mirror.

The two or more meanders may be configured to meander along an axis which is parallel to the first oscillation axis.

The two or more meanders may be configured to meander along an axis which is perpendicular to the first oscillation axis. This makes the mirror less susceptible parasitic movement and in particular makes the mirror less susceptible undesired lateral movement. As the first and second torsional arms meander are along an axis which is perpendicular to the first oscillation axis of the mirror, the first and second torsional arms will offer more resistance against lateral movement of the mirror compared to torsional arms which meander along an axis which is parallel to the first oscillation axis. Thus, the mirror will be less susceptible to lateral movement.

The cross sectional area of each of the first and second torsional arms may be varied over the length of the torsional arms.

Each of the two or more meanders may be configured to comprise a radius of curvature. The radius of curvature may be between 1 microns-70 microns. Preferably the radius of curvature is 5 microns. Alternatively, each of the two or more meanders may be configured to be right angled.

Each of the two or more meanders comprises rounded edges. Alternatively, each of the two or more meanders each comprise square edges.

The first and second torsional arms may be configured to be stiffer at the meanders than at portions of the arms which are between successive meanders. The increased stiffness at the meanders is achieved since the arms larger or thicker at each meander.

The cross sectional area of the first and second torsional arms may be larger at each of the meanders compared to at portions of the arms which are between successive meanders. This configuration enables a more homogenous distribution of stress throughout the first and second torsional arms, thus making the first and second torsional arms less susceptible to breakage. Also the reduced cross-sectional area of the portions between the successive meanders will reduce the average stiffness of the first and second torsional arms, enabling the mirror to be more easily oscillated and thus reducing the power consumption of the MEMS device. Also, this configuration ensures that the first and second torsional arms are stiffer at the meanders than at portions of the arms which are between successive meanders.

The first and second torsional arms may each be configured to have more than two meanders.

The MEMS device may further comprise an electromagnetic actuation means which is arranged to actuate the twisting of the first and second torsional arms about their torsional axes. The torsional axes of the first and second torsional arm may be equal, i.e. the torsional axes may be parallel and lie within the same plane.

The MEMS device may further comprise a third and fourth torsional arm wherein each of the third and fourth torsional arm are configured such that they can twist about torsional axes, so as to oscillate the mirror about an oscillation axes and wherein the third and fourth torsional arms are arranged symmetrically relative to the said oscillation axis.

A third and fourth torsional arm provides more rigidity to the mirror so that the mirror is less likely to undergo undesired movement, such as parasitic lateral movement. Additionally, the stiffness of the torsional arms becomes non-linear as the angle of oscillation of the mirror increases; as the stiffness becomes non-linear, non-linear mechanical movement of each torsional arm can occur e.g. Hysteresis causing undesirable movement of the mirror. When four torsional arms are provided a larger angle of oscillation of the mirror can be achieved before the stiffness of each torsional arm becomes non-linear.

It will be understood that the MEMS device may be provided with any number of torsional arms greater than two torsional arms. For example, the MEMS device may comprise four, six or eight torsional arms. Each of these torsional arms may be provided with two or more meanders and the torsional arms may be arranged symmetrically relative to the first oscillation axis of the mirror.

The third and fourth torsional arms may each be configured to have two or more meanders.

The oscillation axis, about which the third and fourth torsional arms oscillate the mirror, may be said first oscillation axis.

The oscillation axis, about which the third and fourth torsional arms oscillate the mirror, may be a second oscillation axis which is perpendicular to the first oscillation axis, so that the mirror can oscillate about two orthogonal oscillation axes. This provides a 2-D MEMS device, i.e. a MEMS device which has a mirror which can oscillate to scan light both vertically and horizontally across a projection screen.

The MEMS device may further comprise an intermediate support structure. The first and second torsional arms may be arranged to connect the mirror to the intermediate support member. The third and fourth torsional arms may be configured to connect the intermediate support member to the fixed portion. The first and second torsional arms may be configured to oscillate about their torsional axes so that they can oscillate the mirror relative to the intermediate support member so that the mirror is oscillated about the first oscillation axis. The third and fourth torsional arms may be configured to oscillate about their torsional axes so that they can oscillate the intermediate support member and thus also the mirror, about the second oscillation axis. This particular configuration for the first, second, third and fourth torsional arms provides a 2-D MEMS device i.e. MEMS device which has a mirror which can be oscillated along two orthogonal axes, to enable light to be scanned vertically and horizontally.

According to a further aspect of the present invention there is provided a projection device comprising one or more of any of the above mentioned MEMS devices.

BRIEF DESCRIPTION OF THE DRAWINGS

The invention will be better understood with the aid of the description of an embodiment given by way of example only, and illustrated by the figures, in which:

FIG. 3b provides a magnified view of a torsional arm of the MEMS device shown in FIG. 3a;

DETAILED DESCRIPTION OF POSSIBLE EMBODIMENTS OF THE INVENTION

Figure 1:
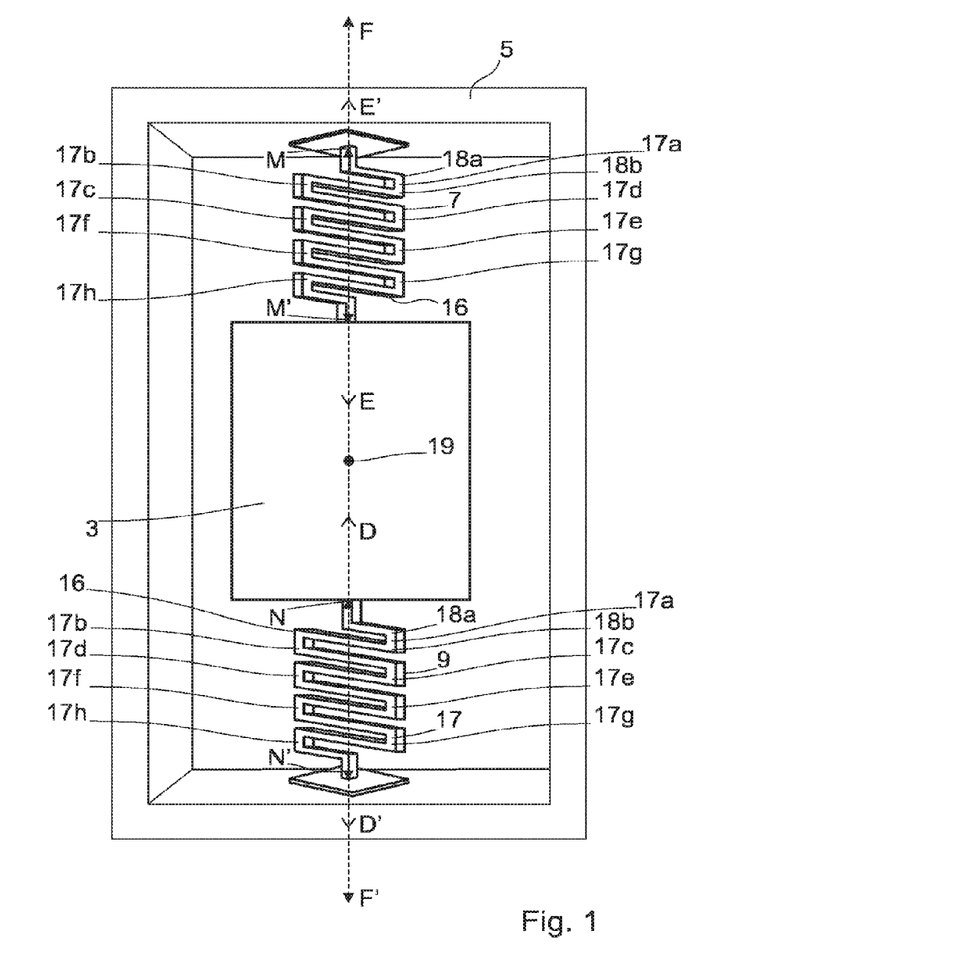
FIG. 1 is a plan view of a MEMS device according to a first embodiment of the present invention.

FIG. 1 is a plan view of a MEMS device 1 according to a first embodiment of the present invention.

The MEMS device 1 comprises, a mirror 3 which is connected to a fixed portion 5 by means of a first and second torsional arm 7,9. Each of the first and second torsional arms 7,9 are configured such that they can twist about torsional axes E-E', D-D' respectively, so as to oscillate the mirror 3 about a first oscillation axis F-F. The first and second torsional arms 7,9 are arranged symmetrically relative to the first oscillation axis F-F.

In this particular example the torsional arms 7,9 are arranged such that both the torsional axes E-E', D-D' are parallel and are in alignment with one another; however, it will be understood that the torsional arms 7,9 may have an alternative arrangement so that the torsional axes E-E', D-D' are off-set from one another and/or may not be parallel. Also, in this particular example the torsional arms 7,9 are arranged so that the torsional axes E-E', D-D' are parallel to and are in alignment with the first oscillation axis F-F of the mirror 3; thus, the torsional axes E-E', D-D' bisect a centre 19 of the mirror 3. However, although the torsional arms 7,9 will be always arranged symmetrically to the first oscillation axis F-F, it will be understood that the torsional arms 7,9 could be arranged so that the torsional axes E-E', D-D' are not parallel and/or off set from the first oscillation axis F-F of the mirror 3.

The first and second torsional arms 7,9 are each configured to have a plurality of meanders 17. In this example the first and second torsional arms are configured to have eight meanders 17a-h each; however it will be understood that the first and second torsional arms 7,9 could have any number of meanders 17 greater than two. Each of the two or more meanders 17a-h comprise right angles; specifically, at each of the meanders 17a-d the torsional arms 7,9 are configured to have two right angle turns 18a,b. Additionally, each of the meanders 17a-h comprises edges 16. The edges 16 are right angled edges.

Each of the first and second torsional arms 7,9 may be configured to have a length between 20 microns-5000 microns. This length is the length measured when first and second torsional arms 7,9 are straightened so as to remove the meanders 17a-h. The first and second torsional arms 7,9 may be configured to extend between 5 microns-400 micros along their respective torsional axes E-E', D-D'. This is the effective length of the first and second torsional arms 7,9 in normal use (i.e. with meanders).

Providing two or more meanders 17 in the first and second torsional arms 7,9 enables the provision of longer torsional arms 7,9 while maintaining a short effective length; thus, longer torsional arms 7,9 can provided in the MEMS device without having to increase the size of the MEMS device 1. The longer torsional arms 7,9 enable the mirror 3 to be oscillated more easily with less torsional force and therefore providing for a low-power MEMS device 1. More importantly, the combination of the meanders 17a-h in first and second torsional arms 7,9 and arranging the torsional arms 7,9 symmetrically relative to the first oscillation axis 15 of the mirror 3, allows for increased distribution of stresses throughout the first and second torsional arms 7,9. The distribution of stresses ensures that the torsional arms 7,9 are less susceptible to breakage. Accordingly, the MEMS device 1 of the present invention has improved shock-resistance.

In the MEMS device 1 the torsional arms 7,9 are configured to extend along axes M-M',N-N' respectively; both axes M-M',N-N' are parallel to the first oscillation axis F-F of the mirror 3, so that the meanders 17a-d meander along an axis M-M',N-N' which is parallel to the first oscillation axis F-F of the mirror 3.

Figure 2:
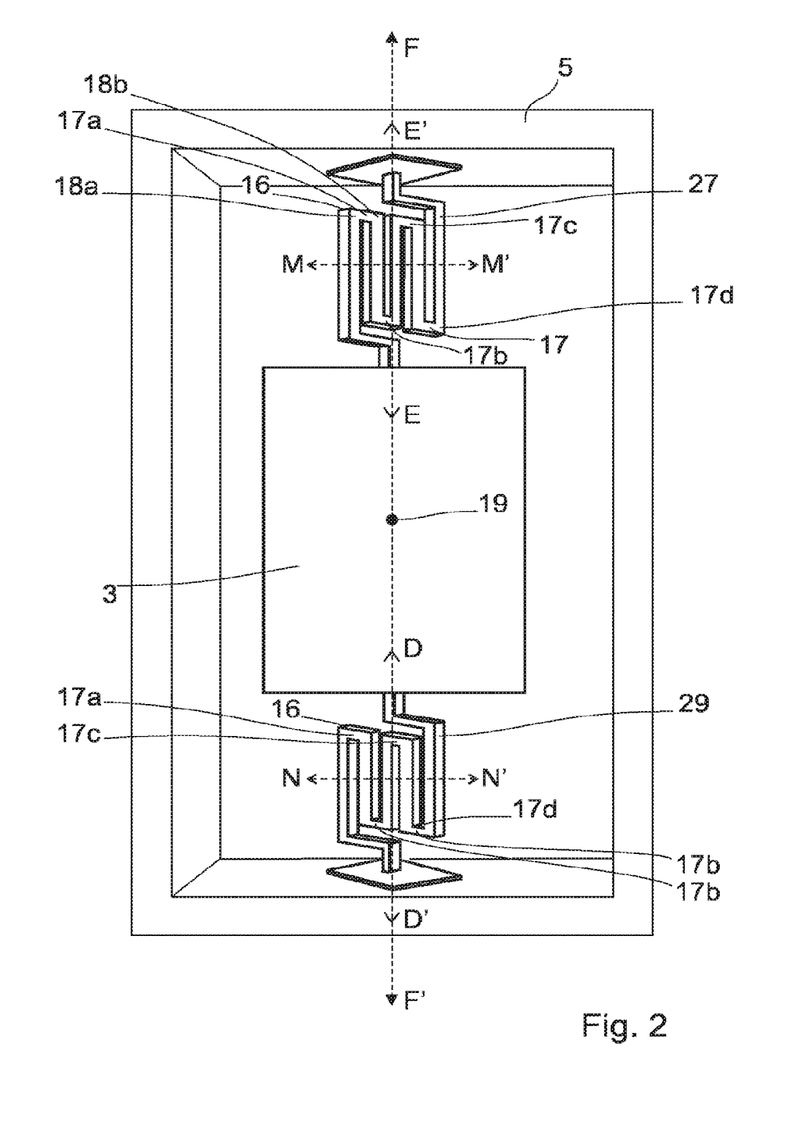
FIG. 2 is a plan view of a MEMS device according to a further embodiment of the present invention.

FIG. 2 provides a plan view of a MEMS device 20 according to a further embodiment of the present invention. The MEMS device 20 has many of the same features of the MEMS device 1 shown in FIG. 1 and like features are awarded the same reference numerals.

The MEMS device 20 comprises torsional arms 27,29, which are arranged symmetrically relative to the first oscillation axis F-F of the mirror 3. Each of torsional arm 27,29 comprises four meanders 17a-d.

In the MEMS device 20 the torsional arms 27,29 are configured to extend along axes M-M',N-N' respectively. Axes M-M',N-N' are each arranged perpendicular to the first oscillation axis 15 of the mirror 3, so that the meanders 17a-d meander along an axis M-M',N-N' which is perpendicular to the first oscillation axis F-F of the mirror 3.

Configuring the torsional arms 27,29 such that the meanders 17a-d meander along an axis M-M',N-N' which is perpendicular to the first oscillation axis F-F' of the mirror 3, makes the mirror 3 less susceptible parasitic movement and in particular makes the mirror 3 less susceptible undesired lateral movement. As the first and second torsional arms 27,29 meander are along an axis M-M',N-N' which is perpendicular to the first oscillation axis of the mirror 3, the first and second torsional arms 27,29 will offer more resistance to lateral movement of the mirror 3 compared to if the torsional arms meandered along an axis which is parallel to the first oscillation axis F-F'. Thus, the mirror 3 will be less susceptible to lateral movement.

Figure 3A:
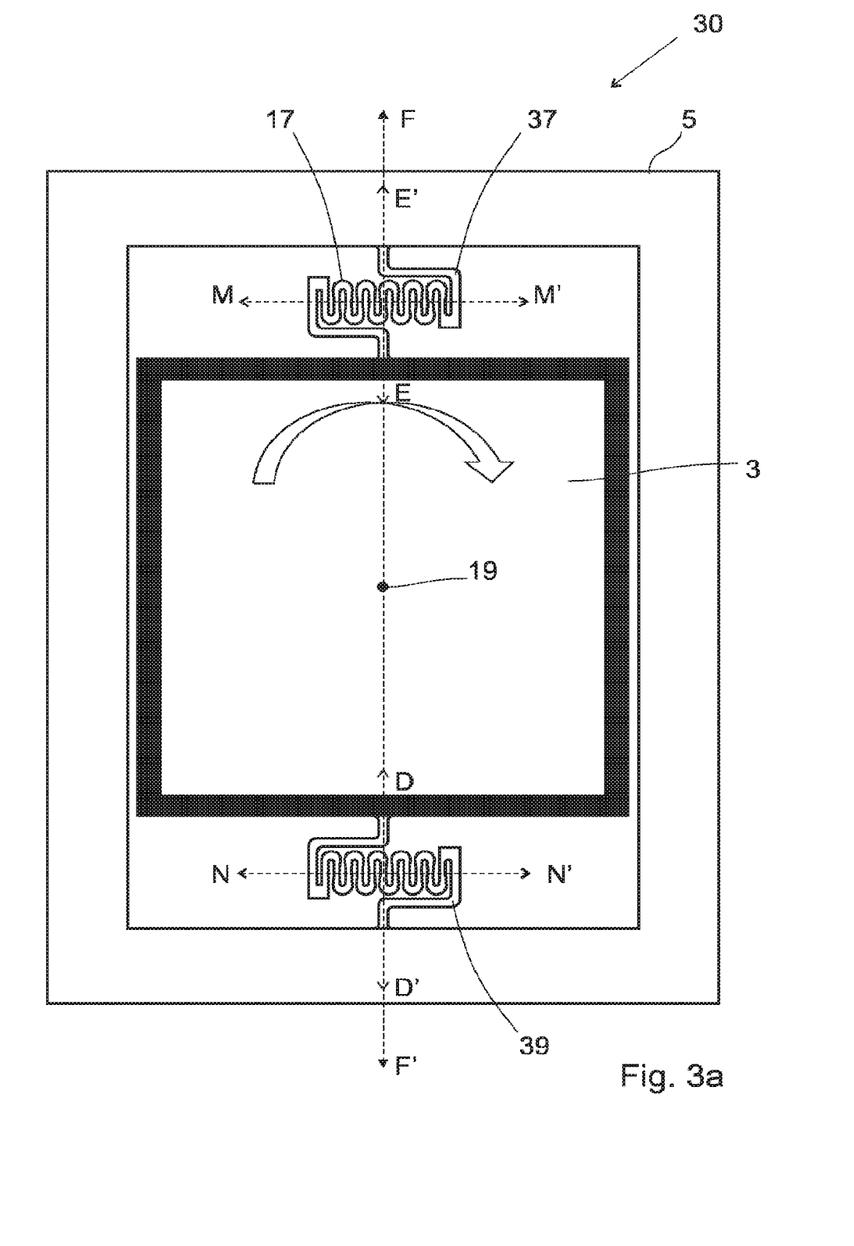
FIG. 3a is a plan view of a MEMS device according to a further embodiment of the present invention.
Figure 3B:
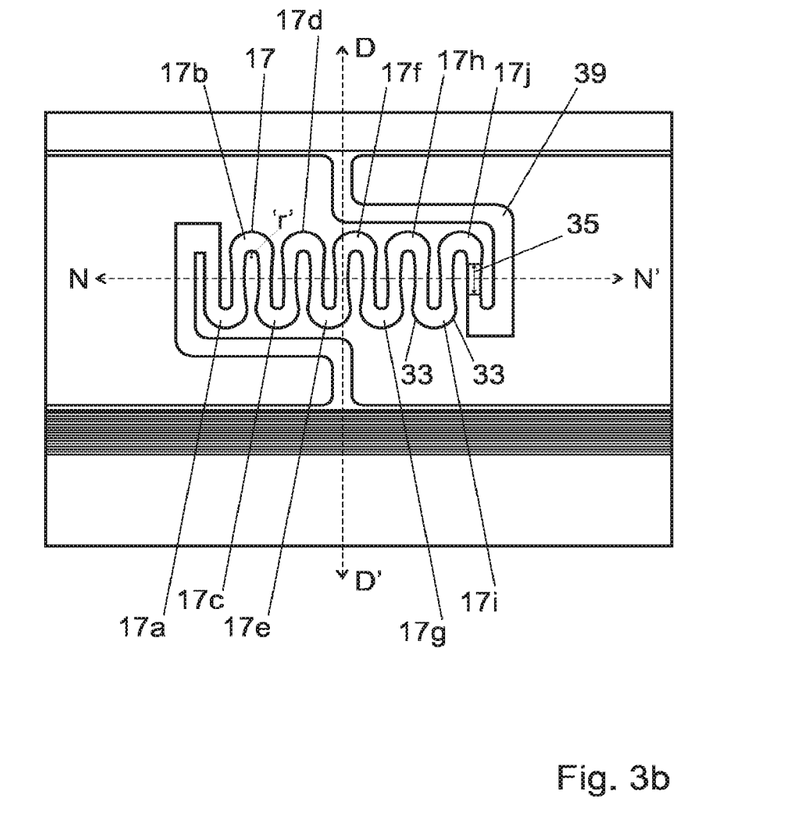

Referring now to FIGS. 3a and 3b; FIG. 3a provides a plan view of a MEMS device 30 according to a further embodiment of the present invention; and FIG. 3b provides a magnified view of one of the torsional arms of the MEMS device 30 shown in FIG. 3a.

The MEMS device 30 has many of the same features of the MEMS device 20 shown in FIG. 2 and like features are awarded the same reference numerals.

The MEMS device 30 comprises first and second torsional arms 37,39 each of which comprises meanders 17; each torsional arms 37,39 comprises ten meanders 17a-j. The cross sectional area of the torsional arms 37,39 varies over the length of the torsional arms 37,39. More specifically, the cross sectional area of the first and second torsional arms 37,39 is larger at each of the meanders 17a-j compared to at portions 35 of the torsional arms 37,39 which are between successive meanders 17a-j. This configuration enables a more homogenous distribution of stress throughout the first and second torsional arms 37,39, thus making the first and second torsional arms 37,39 less susceptible to breakage. Also the reduced cross-sectional area of the portions 35 between the successive meanders 17a-j will reduce the average stiffness of the first and second torsional arms 37,39, enabling the mirror 3 to be more easily oscillated and thus reducing the power consumption of the MEMS device 30.

Each of the meanders 17a-j in the MEMS device 30 is configured to comprise a radius of curvature 'r'. The radius of curvature 'r' is preferably 5 microns. Additionally, each of the two or more meanders comprises rounded edges 33.

Figure 4:
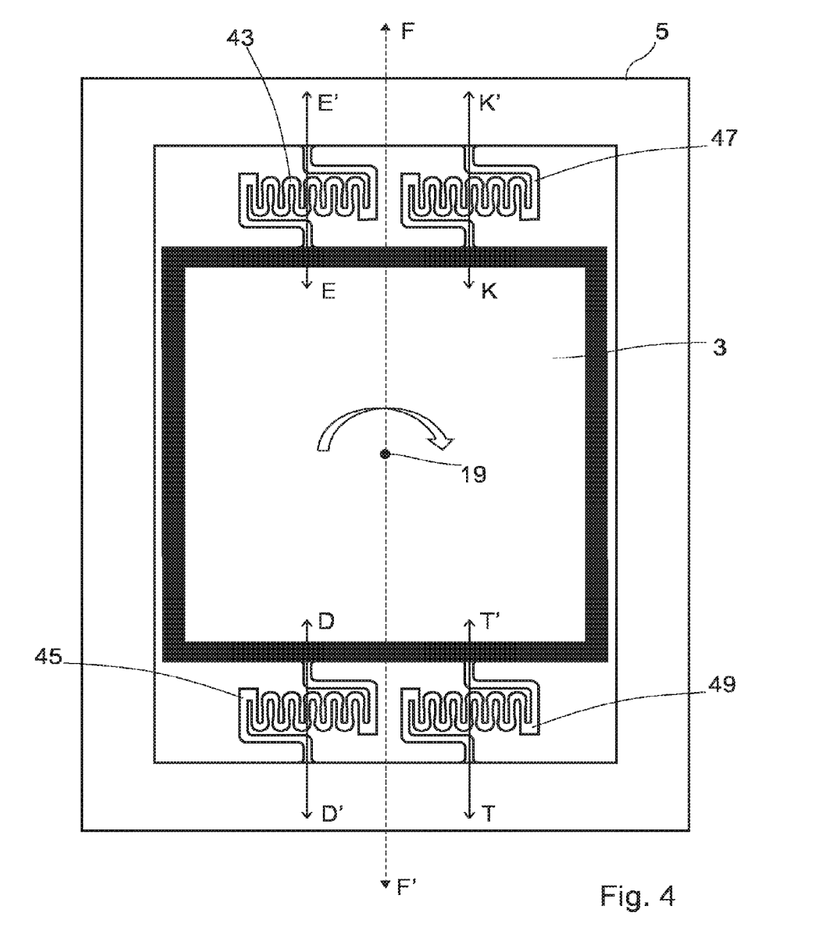
FIG. 4 is a plan view of a MEMS device according to a further embodiment of the present invention.

FIG. 4 is a plan view of a MEMS device 40 according to a further embodiment of the present invention. The MEMS device 40 has many of the same features of the MEMS device shown in FIG. 3a and like features are awarded the same reference numerals.

The MEMS device 40 comprise four torsional arms 43,45,47,49. Each torsional arm 43,45,47,49 is connected directly to the mirror 3 and fixed portion 5 of the MEMS device 40. Each torsional arm 43,45,47,49 is configured such that it can twist about a respective torsional axes E-E', D-D', K-K', T-T', so as to oscillate the mirror 3 about the first oscillation axes F-F'. The torsional arms 43,45,47,49 are arranged symmetrically relative to the said first oscillation axis F-F' of the mirror 3. The torsional axes E-E', D-D', K-K', T-T' are arranged parallel to, but offset from, the first oscillation axis F-F.

Providing four torsional arms 43,45,47,49 provides more rigidity to the mirror 3, so that the mirror 3 is less likely to undergo undesired movement, such as parasitic lateral movement. Additionally, the stiffness of the torsional arms 43,45,47,49 becomes non-linear as the angle of oscillation of the mirror 3 increases; as the stiffness becomes non-linear, non-linear mechanical movement of each torsional arm 43,45,47,49 can occur e.g. Hysteresis, causing undesirable movement of the mirror 3. When four torsional arms 43,45, 47,49 are provided, a larger angle of oscillation of the mirror 3 can be achieved before the stiffness of each torsional arm 43,45,47,49 becomes non-linear.

Figure 5:
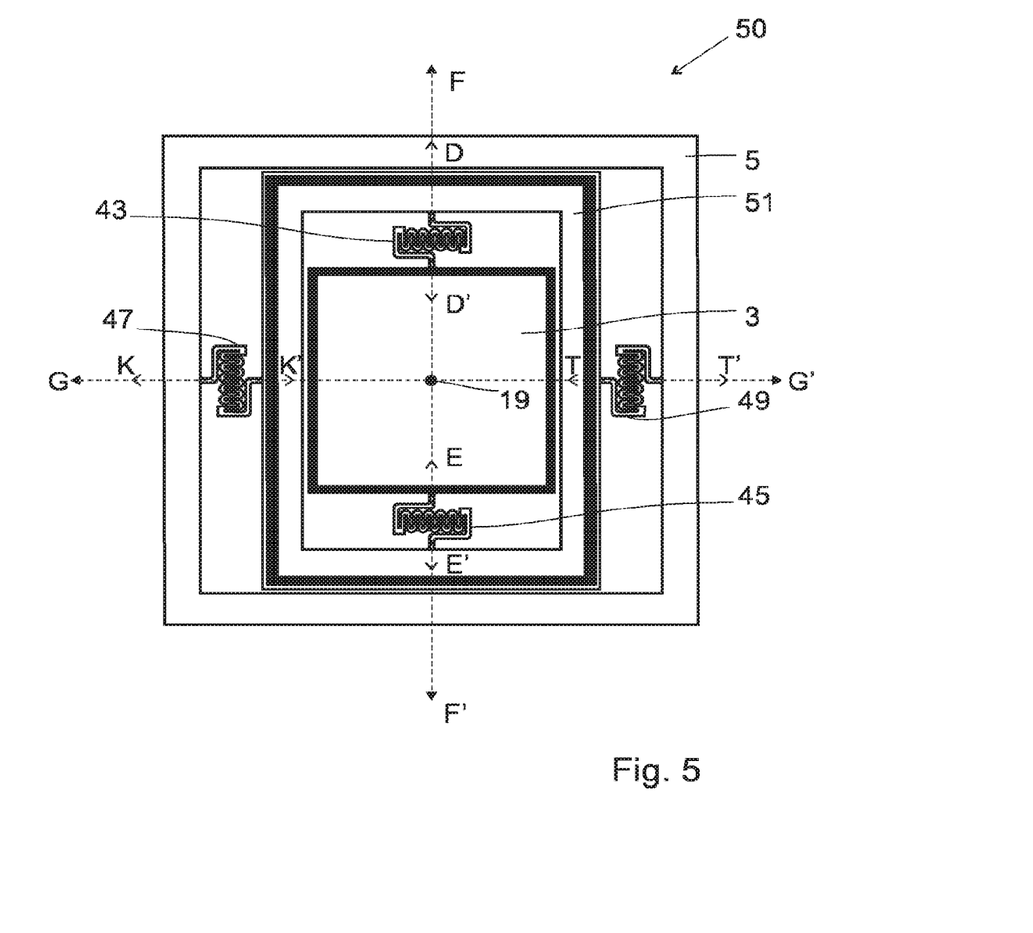
FIG. 5 is a plan view of a MEMS device according to a further embodiment of the present invention.

FIG. 5 is a plan view of a MEMS device 50 according to a further embodiment of the present invention. The MEMS device 50 has many of the same features of the MEMS device 40 shown in FIG. 4 and like features are awarded the same reference numerals.

The MEMS device 50 comprises an intermediate support member 51. Torsional arms 43,45 connect the mirror 3 to the intermediate support member 51, and torsional arms 47,49 connect the intermediate support member 51 to the fixed portion 5. The torsional arms 43,45 can oscillate about torsional axes D-D', E-E' so as to oscillate the mirror 3, relative to the intermediate support member 51, about the first oscillation axis F-F. The torsional arms 47,49 can oscillate about torsional axes K-K', T-T' to oscillate the intermediate support member 51 and thus also the mirror 3, about a second oscillation axis G-G'. Thus, the two torsional arms 43,45 are configured to oscillate the mirror 3 about the first oscillation axis F-F' and the other two of the four torsional arms 47,49 are configured oscillate intermediate support member 51 and thus the mirror 3, about a second oscillation axis G-G' which is perpendicular to the first oscillation axis F-F'.

As a result the mirror 3 in the MEMS device 50 can be oscillated about two orthogonal oscillation axes G-G', F-F; this provides a 2-D mirror 3 i.e. a mirror 3 which can oscillate to scan light both vertically and horizontally across a projection screen.

The torsional arms 43,45,47,49 are arranged symmetrically relative to said first oscillation axis F-F and said second oscillation axis G-G' of the mirror 3. The torsional arms 43,45,47,49 are arranged such that the torsional axes D-D', E-E' are perpendicular to the torsional axes K-K', T-T'. The torsional arms 43,45,47,49 are arranged such that the torsional axes D-D', E-E' are parallel to and in alignment with the first torsional axis F-F' of the mirror 3, and such that the torsional axes K-K', T-T' are parallel to and in alignment with the second torsional axis G-G' of the mirror 3.

Figure 6A:
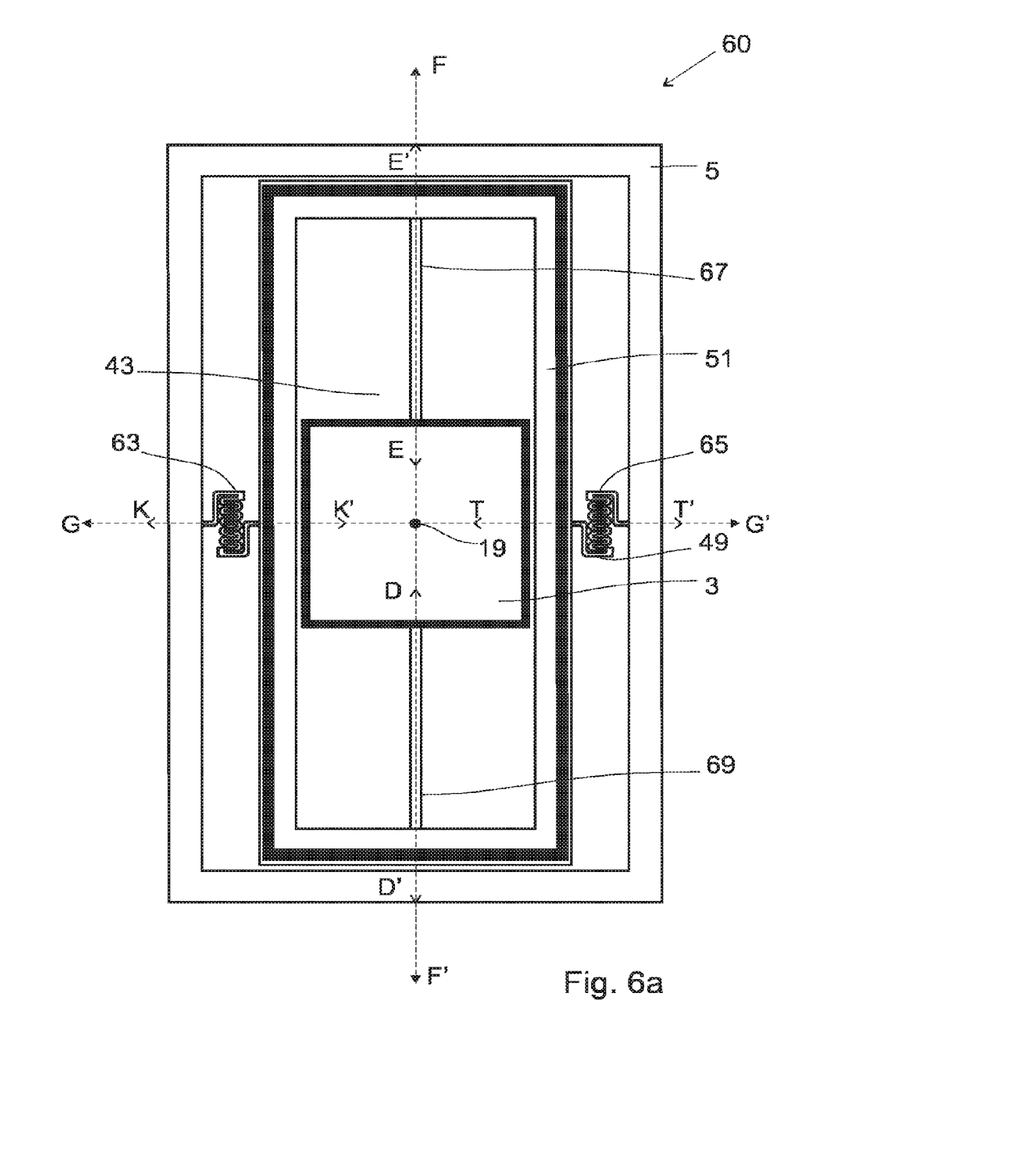
FIGS. 6a and 6b are plan views of MEMS devices according to further embodiments of the present invention.
Figure 6B:
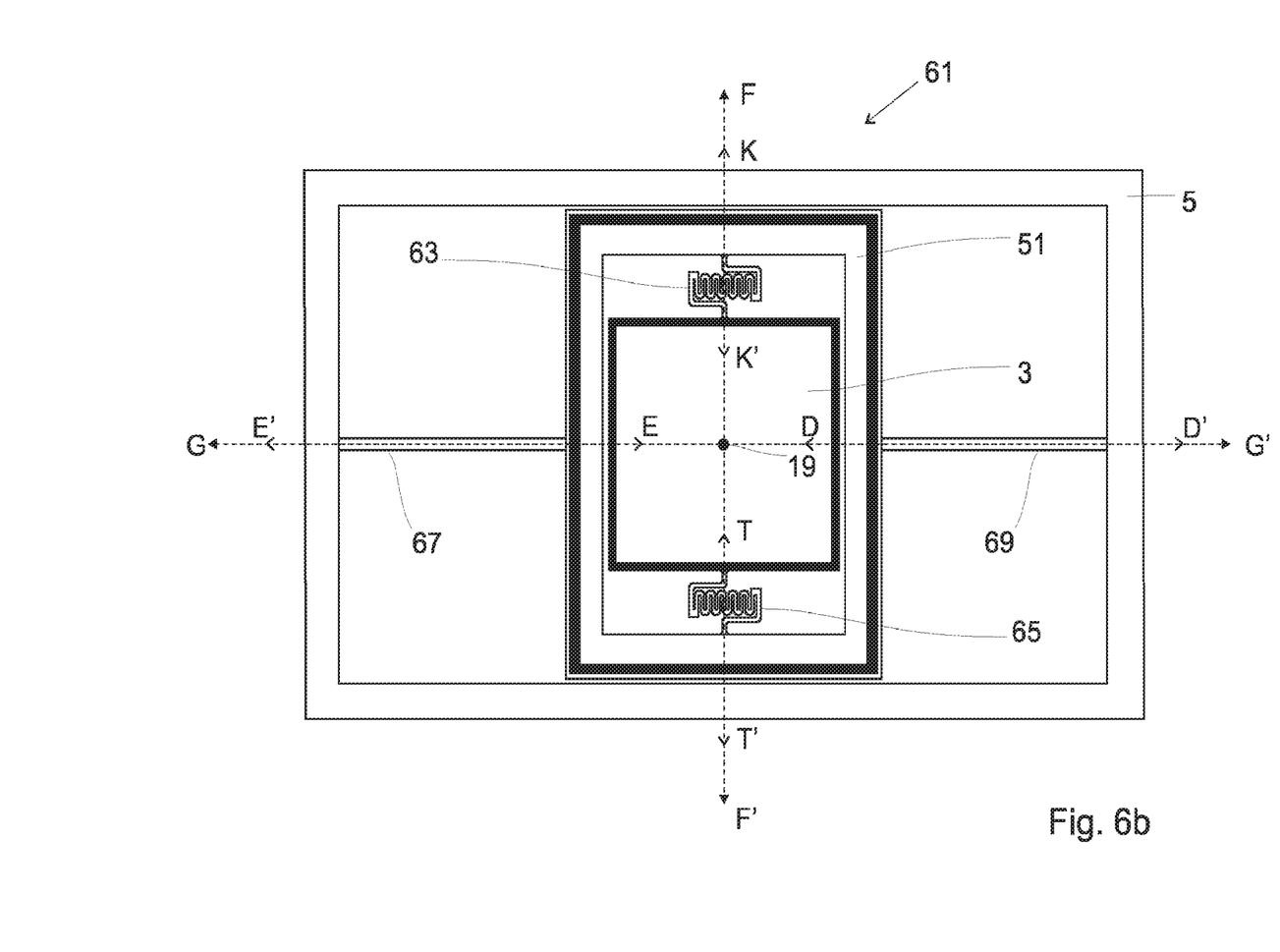

FIGS. 6a and 6b are plan views of MEMS devices 60,61 according to further embodiments of the present invention. The MEMS devices 60,61 shown in FIGS. 6a and 6b have many of the same features of the MEMS device 50 shown in FIG. 5 and like features are awarded the same reference numerals.

The MEMS devices 60,61 shown in FIGS. 6a and 6b also each comprise four torsional arms 63,65,67,69. Two of the torsional arms 63,65 are configured as illustrated in FIG. 3b (i.e. with meanders) and the other two torsional arms 67,69 are configured to be straight (i.e. without meanders).

In the MEMS device 60 the torsional arms 63,65 can oscillate about torsional axes K-K', T-T', while the torsional arms 67,69 can oscillate about torsional axes E-E', D-D'. The torsional arms 63,65,67,69 are arranged symmetrically relative to the first and second oscillation axes F-F', G-G'. The torsional arms 63,65 are arranged such that the torsional axes K-K', T-T' are parallel to, and in alignment with the second oscillation axis G-G', and the torsional arms 67,69 are arranged such that the torsional axes E-E', D-D' are parallel to and in alignment with the first oscillation axis F-F.

The MEMS device 61 is similar to the MEMS device 60 and like features are awarded the same reference numerals. In the MEMS device 61 the torsional arms 63,65,67,69 are also arranged symmetrically relative to the first and second oscillation axes F-F, G-G' of the mirror 3. However, in the MEMS device 61 the torsional arms 63,65 are arranged such that the torsional axes K-K', T-T' are parallel to, and in alignment with the first oscillation axis F-F', and the torsional arms 67,69 are arranged such that the torsional axes E-E', D-D' are parallel to and in alignment with the second oscillation axis G-G'.

Thus, like in the MEMS device 50 shown in FIG. 5, the mirror 3 in the MEMS devices 60,61 can be oscillated about two orthogonal oscillation axes G-G', F-F'; this provides a 2-D mirror 3 i.e. a mirror 3 which can oscillate to scan light both vertically and horizontally across a projection screen.

Although the invention has been described in connection with specific preferred embodiments, it should be understood that the invention as claimed should not be unduly limited to such specific embodiment. Various modifications and variations to the described embodiments of the invention will be apparent to those skilled in the art without departing from the scope of the invention as defined in the appended claims.

For example, it will be understood that the MEMS device may be provided with any number of torsional arms greater than two torsional arms. For example, the MEMS device may comprise four, six or eight torsional arms. The torsional arms may be arranged symmetrically relative to the first oscillation axis of the mirror. Each of these torsional arms may be provided with any number of meanders greater than two.

What is claimed is:

1. A micro-electro mechanical system (MEMS) device comprising:
   a fixed part;
   first and a second torsional arm coupled to the fixed part along the axis of rotation, each of the first and second torsional arms comprising two or more meanders and comprising a cross sectional area that is larger at the two or more meanders than between the two or more meanders; and
   a mirror coupled to the first and the second torsional arms and arranged to rotate about an axis of rotation.

2. The MEMS device of claim 1, each of the two or more meanders comprising a radial curve or a rectangular bend.

3. An apparatus, comprising:
   a fixed part;
   a first torsional arm and a second torsional arm coupled to the fixed part along the axis of rotation, each of the first and second torsional arms comprising two or more meanders and comprising a cross sectional area that is larger at the two or more meanders than between the two or more meanders; and
   a rotational part coupled to the first and the second torsional arms and arranged to oscillate about an axis of rotation.

4. The apparatus of claim 3, the rotational part comprising a mirrored surface.

5. The apparatus of claim 3, each of the two or more meanders comprising a radial curve or a rectangular bend.

6. A system comprising:
   a fixed part;
   a first torsional arm and a second torsional arm coupled to the fixed part along the axis of rotation, each of the first and second torsional arms comprising two or more meanders and comprising a cross sectional area that is larger at the two or more meanders than between the two or more meanders;
   a rotational part coupled to the first and the second torsional arms and arranged to oscillate about an axis of rotation; and
   an actuator to oscillate the rotational part about the axis of rotation.

7. The system of claim 6, the rotational part comprising a mirrored surface.

8. The system of claim 6, the actuator comprising a magnetic actuator, an electromagnetic actuator, an electrostatic actuator, a thermal actuator, or a piezo-electric actuator.

9. The system of claim 6, each of the two or more meanders comprising a radial curve or a rectangular bend.

* * * * *

UNITED STATES PATENT AND TRADEMARK OFFICE
CERTIFICATE OF CORRECTION

PATENT NO. : 9,983,401 B2
APPLICATION NO. : 15/156200
DATED : May 29, 2018
INVENTOR(S) : Nicolas Abele, Faouzi Khechana and Julien Gamet Page 1 of 1

It is certified that error appears in the above-identified patent and that said Letters Patent is hereby corrected as shown below:

Column 5, Line 55, replace "F-F" with -- F-F' --.

Column 5, Line 57, replace "F-F" with -- F-F' --.

Column 6, Line 3, replace "F-F" with -- F-F' --.

Column 6, Line 5, replace "F-F" with -- F-F' --.

Column 6, Line 45, replace "F-F" with -- F-F' --.

Column 6, Line 47, replace "F-F" with -- F-F' --.

Column 6, Line 56, replace "F-F" with -- F-F' --.

Column 6, Line 63, replace "F-F" with -- F-F' --.

Column 7, Line 54, replace "F-F" with -- F-F' --.

Column 8, Line 13, replace "F-F" with -- F-F' --.

Column 8, Line 24, replace "F-F" with -- F-F' --.

Column 8, Line 58, replace "F-F" with -- F-F' --.

Column 8, Line 63, replace "F-F" with -- F-F' --.

Signed and Sealed this
Twenty-first Day of August, 2018

Andrei Iancu
*Director of the United States Patent and Trademark Office*